United States Patent [19]

Tsuge et al.

[11] Patent Number: 4,544,423

[45] Date of Patent: Oct. 1, 1985

[54] AMORPHOUS SILICON SEMICONDUCTOR AND PROCESS FOR SAME

[75] Inventors: Kazunori Tsuge; Yoshihisa Tawada, both of Kobe; Yoshihiro Hamakawa, Kawanishi, all of Japan

[73] Assignee: Kanegafuchi Kagaku Kogyo Kabushiki Kaisha, Osaka, Japan

[21] Appl. No.: 578,939

[22] Filed: Feb. 10, 1984

[51] Int. Cl.$^4$ .................. C23C 11/00; H01L 31/18
[52] U.S. Cl. .................................. 148/174; 148/175; 136/258; 427/39; 427/54.1; 427/74; 427/86; 427/93
[58] Field of Search ............... 357/2; 427/39, 54.1, 427/74, 86, 93; 136/258 AM; 148/175, 174

[56] References Cited

U.S. PATENT DOCUMENTS

| | | | |
|---|---|---|---|
| 4,217,374 | 8/1980 | Ovshinsky et al. | 427/36 |
| 4,348,428 | 9/1982 | Rockley et al. | 136/258 AM |
| 4,410,559 | 10/1983 | Hamakawa et al. | 427/86 |
| 4,435,445 | 3/1984 | Allred et al. | 136/258 AM |
| 4,448,801 | 5/1984 | Fukuda et al. | 427/54.1 |
| 4,466,992 | 8/1984 | Dreiling | 427/54.1 |
| 4,481,229 | 11/1984 | Suzuki et al. | 429/86 |
| 4,495,218 | 1/1985 | Azuma et al | 427/93 |

Primary Examiner—Brian E. Hearn
Assistant Examiner—Hunter L. Auyang
Attorney, Agent, or Firm—Armstrong, Nikaido, Marmelstein & Kubovcik

[57] ABSTRACT

A process for preparing an amorphous silicon semiconductor comprising steps of plasma decomposing silicon compounds and carrying out photolysis of the silicon compounds. According to the process, the growth rate of the semiconductor is greatly increased. The obtained amorphous silicon semiconductor has excellent electrical and optical properties and is useful as a photovoltaic element.

8 Claims, No Drawings

AMORPHOUS SILICON SEMICONDUCTOR AND PROCESS FOR SAME

BACKGROUND OF THE INVENTION

The present invention relates to an amorphous silicon semiconductor and a process for preparing the same.

With respect to an amorphous silicon prepared from silane ($SiH_4$) by plasma decomposition, since D. E. Carlson et al prepared as solar cell using an amorphous silicon semiconductor in 1976 based on the discovery by W. E. Spear et al in 1976 that the conductivity of the amorphous silicon is greatly varied by doping with $PH_3$ or $B_2H_6$, a solar cell using a thin film amorphous silicon has been of great interest, and various studies for improving the conversion efficiency of the solar cell have been actively pursued.

Hitherto there has been proposed several types of structures such as the Shottky barrier, p-i-n junction, MIS and hetero junction for a photovoltaic element using thin films of the amorphous silicon semiconductor. Among them, the Schottky barrier type, p-i-n junction type and MIS type photovoltaic elements are useful as a solar cell having a high conversion efficiency. For instance, the Schottky barrier type solar cell has a conversion efficiency of 5.5% (D. E. Carlson et al "IEEE Trans. Electron Devices" EP-24, 449(1977)), the MIS type solar cell has a conversion efficiency of 4.8% (J. I. B. Wilson et al "Nature" 272, 152(1978)) and the p-i-n junction type solar cell has a conversion efficiency of 4.5% (Yoshihiro Hamakawa et al "Surface Sci." 86, 486(1979)).

In a process for preparing the photovoltaic element, however, the growth rate of an an i-layer is low, i.e. 1 to 2 Å/sec, which prevents production of a low-cost element. For resolving the defect, various attempts have been made by changing reaction conditions. For instance, there is proposed an attempt for increasing growth rate by increasing power in the glow discharge. When the power is increased, however, properties of the prepared thin film amorphous silicon deteriorate because bombardment of the generated plasma increases (J. C. Knights, "Appl. Phys. Lett." 35(3), 244(1979)). There is also proposed an attempt in which pressure in the operation is adjusted or an attempt in which the temperature of the substrate is varied. However, both attempts have defects in that properties, particularly electrical properties, of the prepared amorphous silicon semiconductor become inferior.

An object of the present invention is to provide a process for preparing an amorphous silicon semiconductor at an increased growth rate without impairing the properties of the semiconductor.

Another object of the present invention is to provide an amorphous silicon semiconductor having good electrical and optical properties.

SUMMARY OF THE INVENTION

According to the present invention, there is provided a process for preparing an amorphous silicon semiconductor comprising the steps of plasma decomposing silicon compounds and carrying out photolysis of the silicon compounds. According to the process, the growth rate of the semiconductor can be increased to a practical level. Also, in a process for preparing a p-type or n-type amorphous silicon semiconductor, efficiency of doping is considerably improved in the presence of light.

The amorphous silicon semiconductor prepared by the process of the present invention has excellent electrical and optical properties and is useful as a photovoltaic element.

DETAILED EXPLANATION OF THE INVENTION

In the process of the invention, the photolysis is carried out by radiating light unto silicon compounds at the same time or before the plasma decomposition of the silicon compounds or a mixed gas of silicon compounds and diluent gases.

The light to be radiated is light which can decompose the silicon compound, preferably light having a wavelength of not more than 5000 Å, and having an intensity of not less than 20 $mW/cm^2$. With light having a wavelength of more than 5000 Å, photolysis of the silicon compound is hard to generate. With light having an intensity of less than 20 $mW/cm^2$, the rate of the photolysis becomes too low to improve the growth rate of the amorphous silicon semiconductor. From a viewpoint of cost such as energy cost and the viewpoint of a material of a window through which the light passes, the wavelength and the intensity of the light are preferably not less than 700 Å and not more than 1000 $W/cm^2$, respectively.

The plasma decomposition of the silicon compound may be carried out according to a conventional method such as C-coupled method or L-coupled method by means of high frequency glow discharge or dc glow discharge. As conditions of the glow discharge in the present invention, conventional conditions may be employed. For instance, conditions described in Japanese Unexamined Patent Publication Nos. 122471/1977 and 68681/1980 can be employed.

Typical examples of the silicon compound are, for instance, silane ($SiH_4$) and a derivative thereof, tetrafluorosilane ($SiF_4$) and a derivative thereof, and an admixture thereof. Typical examples of the diluent gas which is admixed with the silicon compound are, for instance, hydrogen gas, argon gas, helium gas, a hydrocarbon gas, a carbon fluoride gas, a gas of a compound including nitrogen and hydrogen or fluorine, and an admixture thereof. The concentration of the silicon compound in the mixed gas is usually about not less than 0.5% by mole. The silicon compound may be also employed alone.

According to the present invention, a semiconductor of an amorphous silicon, an amorphous silicon carbide, an amorphous silicon nitride or an admixture thereof can be prepared. When the amorphous silicon semiconductor is doped with an element of Group III of the Periodic Table a p-type amorphous silicon semiconductor can be prepared, and when the amorphous silicon semiconductor is doped with an element of Group V of the Periodic Table an n-type amorphous silicon compound can be prepared.

The process of the present invention can be applied to every preparation of the p-type, i-type and n-type semiconductors. Particularly the efficiency of doping in the preparations of the p-type and n-type semiconductors can be increased in addition to the fact that the growth rate is increased without impairing the properties such as electrical properties of the semiconductor.

The amorphous silicon semiconductor prepared by the process of the present invention has excellent electrical and optical properties and is useful as an element for a solar cell, a photoswitch, a photosensor, and the like, or as a photosensitive material.

The present invention is more particularly explained by means of the following typical embodiments in which the amorphous silicon semiconductor is used as a photovoltaic element of a solar cell.

The amorphous silicon semiconductor of the present invention can be used as a photovoltaic element for any solar cell wherein an active layer is an intrinsic amorphous silicon semiconductor. Examples of the solar cell are: a solar cell into which sunlight is introduced from a p-layer, such as a solar cell having a construction of glass/transparent electrode/p-i-n type amorphous silicon semiconductor/aluminum; a solar cell into which sunlight is introduced from an n-layer, such as a solar cell having a construction of stainless steel/p-i-n type amorphous silicon semiconductor/transparent electrode; a solar cell having a thin layer of an insulator or a metal between the p-layer and the transparent electrode in the above solar cells; a Schottky barrier type solar cell; a MIS type solar cell; and the like.

As the substrate of the solar cell, every substrate used in conventional solar cells may be employed. Examples of the substrate are, for instance, a glass sheet, a polymer film or sheet, a metal sheet, and the like. A preferable transparent electrode is made of indium tin oxide (ITO) or $SnO_2$. The electrode may be formed by vacuum evaporation on a glass substrate or directly on the p-type or n-type amorphous silicon semiconductor.

A typical amorphous silicon semiconductor having a p-i-n structure consists of an i-layer of an intrinsic amorphous silicon semiconductor having a lifetime of carriers of not less than about $10^{-7}$ second, a localized state density of not more than about $10^{17} cm^{-3} \sim eV^{-1}$ and a mobility of not less than about $10^{-3} cm^2/V \cdot sec$, a p-layer of an amorphous silicon semiconductor doped with an element of Group III of the Periodic Table and an n-layer of an amorphous silicon semiconductor doped with an element of Group V of the Periodic Table.

A typical construction of a solar cell including the p-i-n type semiconductor is a transparent electrode-p-type amorphous silicon semiconductor/i-type amorphous silicon semiconductor/n-type amorphous silicon semiconductor/electrode. Sunlight is introduced from the transparent electrode. The thickness of the p-layer is about 30 Å to about 300 Å, preferably about 50 Å to about 200 Å, and the thickness of the i-layer is about 2500 Å to about 1000 Å. Since the n-layer is a layer for producing ohmic contact, the thickness of the n-layer is not particularly limited, and is preferably about 150 Å to about 600 Å.

Another typical construction of a solar cell including the p-i-n type semiconductor is a transparent electrode/n-type amorphous silicon semiconductor/i-type amorphous silicon semiconductor/p-type amorphous silicon semiconductor/electrode. Sunlight is introduced from the transparent electrode. Preferable thicknesses of the n-layer and the i-layer are about 30 Å to about 300 Å, particularly about 50 Å to about 200 Å and about 2500 Å to about 10000 Å, respectively. The thickness of the p-layer is not particularly limited, and is preferably about 150 Å to about 600 Å.

The present invention is more particularly described and explained by means of the following Examples. It is to be understood that the present invention is not limited to the Examples and various changes and modifications may be made in the invention without departing from the spirit and scope thereof.

COMPARATIVE EXAMPLE

A reactor of 11 cm in inner diameter made of quartz was employed and glow discharge was carried out with a high frequency of 13.56 MHz.

In the above reaction conditions, an i-type amorphous silicon semiconductor was prepared from a $SiH_4$ gas diluted with $H_2$ (concentration of $SiH_4 = 10\%$ by mole). An n-type amorphous silicon semiconductor was prepared from a mixed gas of $SiH_4$, $H_2$ and $PH_3$ ($PH_3/SiH_4 = 0.5\%$ by mole, concentration of $SiH_4 = 6.7\%$ by mole). A p-type amorphous silicon semiconductor was prepared from a mixed gas of $SiH_4$, $H_2$ and $B_2H_6$ ($B_2H_6/SiH_4 = 0.2\%$ by mole, concentration of $SiH_4 = 8.3\%$ by mole).

The growth rate of the i-layer was 1.8 Å/sec and the dark conductivities of the p-layer and the n-layer were $4 \times 10^{-3} (\Omega \cdot cm)^{-1}$ and $2 \times 10^{-2} (\Omega \cdot cm)^{-1}$ at 20° C., respectively.

According to the above procedures, a solar cell was prepared by depositing, in series, the p-type amorphous silicon semiconductor having a thickness of 135 Å on a surface of a $SnO_2$ thin film (25 $\Omega/\square$) formed on a glass substrate, the i-type amorphous silicon semiconductor having a thickness of 5000 Å and the n-type amorphous silicon semiconductor having a thickness of 500 Å, and then forming a thin film of aluminum (3.3 $mm^2$) on the n-layer by vacuum evaporation. Properties of the solar cell were measured under a solar illumination of 100 $mW/cm^2$ (AM-1 solar simulator). The short circuit current (Jsc), the open circuit voltage (Voc) and the conversion efficiency ($\eta$) of the solar cell were 10.3 $mA/cm^2$, 0.75 V and 4.6%, respectively.

EXAMPLE 1

As a reactor, a reactor of 11 cm in inner diameter made of quartz with a window made of $CaF_2$ was employed. An amorphous silicon semiconductor having the p-i-n structure was prepared by repeating the same procedures as in Comparative Example except that light was introduced through the window of $CaF_2$ from a low pressure xenon lamp which radiates light having a continuous wavelength in the range of 1500 to 2000 Å. An intensity of the light was adjusted to 50 $mW/cm^2$ at the window.

The growth rate of the i-layer was 7 Å/sec, and the dark conductivities (at 20° C.) of the p-layer and the n-layer were $8 \times 10^{-3} (\Omega \cdot cm)^{-1}$ and $5 \times 10^{-2} (\Omega \cdot cm)^{-1}$, respectively.

The growth rate of the i-layer is about 4 times that the Comparative Examples, and also the dark conductivities of the p-layer and the n-layer are about 2 times those the Comparative Example.

The properties of the solar cell having the same structure and thickness as that the Comparative Example, except that the amorphous silicon semiconductor was prepared by the above-mentioned procedures, were measured in the same manner as in the Comparative Example. The results were $Jsc = 11.9$ $mA/cm^2$, $Voc = 0.79$ V and $\eta = 5.7\%$. The results show that the property of the solar cell is is far superior to that in the Comparative Example, by 24%.

EXAMPLE 2

The same procedures as in Example 1 were repeated except that light was introduced through the window from a high pressure xenon lamp to prepare an amorphous silicon semiconductor. Before the incidence on the window, light having a wavelength of more than 5000 Å was filtered off. The intensity of the light was adjusted to 20 mW/cm² at the window.

The growth rate of the i-layer was 4 Å/sec, which is about 2 times that in the Comparative Example.

EXAMPLE 3

As a reactor, a reactor in which a chamber for photolysis having a window made of LiF was provided just in front of the reactor used in the Comparative Example. Through the window, light was introduced from a low pressure krypton lamp which radiates light having a continuous wavelength in the range of 1200 to 1800 Å. The intensity of the light was adjusted to 30 mW/cm² at the window.

The same procedures as in the Comparative Example were repeated except that the photolysis was carried out under the above conditions to prepare an amorphous silicon semiconductor.

The growth rate of the i-layer was 10 Å/sec, and the dark conductivities (at 20° C.) of the p-layer and the n-layer were $2.5 \times 10^{-2}$ $(\Omega \cdot cm)^{-1}$ and $7 \times 10^{-2}$ $(\Omega \cdot cm)^{-1}$, respectively. The results show the fact that the growth rate and the doping efficiency are greatly improved.

EXAMPLE 4

As a reactor, a reactor used in Example 1 except that the window was made of LiF was employed. The same procedures as in Example 1 were repeated except that the source of light used in Example 3 was employed and that SiH₄ gas diluted with H₂, B₂H₆ gas and CH₄ gas (SiH₄: CH₄=1: 1 by mole, B₂H₆/(SiH₄+CH₄)=0.2% by mole) were introduced into the reactor to prepare a p-type amorphous silicon semiconductor.

The dark conductivity of the p-layer was $4 \times 10^{-5}$ $(\Omega \cdot cm)^{-1}$ at 20° C.

In order to confirm the effect of the incidence of the light, a p-layer was prepared by repeating the above-mentioned procedures except that light was not introduced. The dark conductivity of the comparative p-layer was $5 \times 10^{-6}$ $(\Omega \cdot cm)^{-1}$ at 20° C.

What we claim is:

1. A process for preparing an amorphous silicon semiconductor by treating a silicon compound under conditions which will cause the silicon compound to undergo photolysis and plasma decomposition, said process comprising:
   (a) irradiating the silicon compound with light of sufficient wave length and intensity to decompose the silicon compound and
   (b) subjecting the silicon compound to conditions of glow discharge.

2. The process of claim 1, wherein the plasma decomposition is carried out by high frequency glow discharge.

3. The process of claim 1, wherein the photolysis is carried out at the same time as the plasma decomposition.

4. The process of claim 1, wherein the photolysis is carried out before the plasma decomposition.

5. The process of claim 1, wherein the photolysis is carried out with light having a wavelength of not more than 5000 Å.

6. The process of claim 1, wherein the photolysis is carried out with light having an intensity of not less than 20 mW/cm².

7. The process of claim 1, wherein the amorphous silicon semiconductor is doped with an element of Group III of Group V of the Periodic Table.

8. The process of claim 1, wherein the amorphous silicon semiconductor is an amorphous silicon, an amorphous silicon carbide, an amorphous silicon nitride or an admixture thereof.

* * * * *